United States Patent
Nakaoka

(10) Patent No.: US 10,395,720 B2
(45) Date of Patent: Aug. 27, 2019

(54) PSEUDO STATIC RANDOM ACCESS MEMORY AND REFRESH METHOD THEREOF

(71) Applicant: Winbond Electronics Corp., Taichung (TW)

(72) Inventor: Yuji Nakaoka, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/121,642

(22) Filed: Sep. 5, 2018

(65) Prior Publication Data

US 2019/0139597 A1  May 9, 2019

(30) Foreign Application Priority Data

Nov. 9, 2017  (JP) ................................ 2017-216185

(51) Int. Cl.
*G11C 11/406* (2006.01)
*G11C 11/4076* (2006.01)
*G11C 11/408* (2006.01)

(52) U.S. Cl.
CPC .... *G11C 11/40615* (2013.01); *G11C 11/4076* (2013.01); *G11C 11/4085* (2013.01); *G11C 11/406* (2013.01); *G11C 2211/4066* (2013.01)

(58) Field of Classification Search
CPC .......... G11C 11/40615; G11C 11/4076; G11C 11/4085; G11C 2211/4066
USPC .......................................... 365/222; 711/167
See application file for complete search history.

(56) References Cited

U.S. PATENT DOCUMENTS

| 4,939,695 A * | 7/1990 | Isobe .................... G11C 11/406 365/222 |
| 5,206,830 A | 4/1993 | Isobe |
| 5,333,128 A | 7/1994 | Yoon |
| 5,544,120 A * | 8/1996 | Kuwagata ............. G11C 11/406 331/175 |
| 2004/0027895 A1* | 2/2004 | Nakagawa ............ G11C 11/406 365/202 |

(Continued)

FOREIGN PATENT DOCUMENTS

| CN | 100416701 | 9/2008 |
| TW | I235375 | 7/2005 |

OTHER PUBLICATIONS

"Office Action of Taiwan Counterpart Application," dated Nov. 27, 2018, p. 1-p. 6.

*Primary Examiner* — Ly D Pham
(74) *Attorney, Agent, or Firm* — JCIPRNET

(57) ABSTRACT

A pseudo static random access memory (SRAM) and a refresh method for a pseudo SRAM are provided. The refresh method includes: providing a basic clock signal; at a first time point, enabling a chip enable signal to perform a first write operation, and receiving write data during an enabled time period of the chip enable signal; at a delay time point after the first time point, enabling a sub-word line driving signal, and writing the write data to at least one selected sense amplifier during an enabled time period of the sub-word line driving signal; and receiving a refresh request signal, and determining whether the refresh request signal is enabled according to an end time point of the enabled time period of the chip enable signal to determine a timing of starting a refresh operation.

15 Claims, 6 Drawing Sheets

(56) References Cited

U.S. PATENT DOCUMENTS

2005/0219930 A1 10/2005 Takahashi
2011/0255360 A1 10/2011 Takahashi

* cited by examiner

PSEUDO STATIC RANDOM ACCESS MEMORY AND REFRESH METHOD THEREOF

CROSS-REFERENCE TO RELATED APPLICATION

This application claims the priority benefit of Japan application serial no. 2017-216185, filed on Nov. 9, 2017. The entirety of the above-mentioned patent application is hereby incorporated by reference herein and made a part of this specification.

BACKGROUND OF THE INVENTION

Field of the Invention

The disclosure relates to a refresh method, and in particular, to a refresh method of a pseudo static random access memory (SRAM).

Description of Related Art

Referring to FIG. 1, FIG. 1 is a schematic waveform diagram illustrating a conventional refresh method of a pseudo SRAM. In the related art, a clock signal provided by a signal generator is used as a basic clock signal CLK in the pseudo SRAM. When a chip enable signal CE# is enabled in synchronization with a switch state of the basic clock signal CLK, the pseudo SRAM may be activated to start to perform relevant operations. Through an address data signal ADi, in an enabled time period of the chip enable signal CE#, address data W, A1 to A3 and write data D1 to D4 may be sequentially received. Next, a sub-word line driving signal RASB may be enabled (lowered to the logic low level) and may be configured to activate a corresponding sub-word line in the pseudo SRAM. Specifically, in a write cycle WC11 in which the sub-word line driving signal RASB is enabled, the write data D1 to D4 are written to sense amplifiers corresponding to the address data W, A1 to A3.

It is noted that, in FIG. 1, after the write cycle WC11, the pseudo SRAM enters a refresh cycle RC1 based on the enabled state of a refresh request signal REFRQ. However, since a new write cycle WC21 is about to start at this time, the time period of the refresh cycle RC1 is overly short (with only two cycles of the basic clock signal CLK) such that the refresh operation cannot be effectively performed. More importantly, when the write cycle WC21 is entered, the refresh request signal REFRQ is reset to a disabled (logic low) state at the same time. As a result, the refresh operation cannot be effectively performed, such that internal data are likely to be lost, and data reliability of the pseudo SRAM is reduced.

SUMMARY OF THE INVENTION

The invention provides a pseudo SRAM and a refresh method of the pseudo SRAM that can effectively perform a refresh operation.

The refresh method of the invention is applicable to a pseudo SRAM. The refresh method includes the following steps. A basic clock signal is provided. At a first time point, a chip enable signal is enabled to perform a first write operation, and write data is received during an enabled time period of the chip enable signal. At a delay time point after the first time point, a sub-word line driving signal is enabled, and the write data is written to at least one selected sense amplifier during an enabled time period of the sub-word line driving signal. A refresh request signal is received, and it is determined whether the refresh request signal is enabled according to an end time point of the enabled time period of the chip enable signal to determine a timing of starting a refresh operation.

The pseudo SRAM of the invention includes a refresh signal generator, a controller, a dynamic memory array, and an input/output circuit. The refresh signal generator generates a refresh request signal. The controller is coupled to the refresh signal generator. The dynamic memory array is coupled to the controller. The input/output circuit is coupled to the dynamic memory array and the controller. Specifically, the controller is configured to: receive a basic clock signal; receive a chip enable signal enabled at a first time point to perform a first write operation, and receive write data during an enabled time period of the chip enable signal; at a delay time point after the first time point, enable a sub-word line driving signal, and write the write data to at least one selected sense amplifier during an enabled time period of the sub-word line driving signal; and receive the refresh request signal, and determine whether the refresh request signal is enabled according to an end time point of the enabled time period of the chip enable signal to determine a timing of starting a refresh operation.

In light of the above, in the invention, a time difference between the first time point of enabling the chip enable signal and the delay time point of enabling the sub-word line driving signal is reduced in response to the refresh request signal that is enabled relatively early to start the refresh operation. Moreover, in the embodiments of the invention, in response to the refresh request signal that is enabled relatively late, the refresh operation is performed after the next write operation is completed. Accordingly, the refresh operation of the pseudo SRAM of the invention can be effectively performed, and stability of the memory data therein can be maintained.

To provide a further understanding of the aforementioned and other features and advantages of the disclosure, exemplary embodiments, together with the reference drawings, are described in detail below.

DESCRIPTION OF THE EMBODIMENTS

Figure 1:
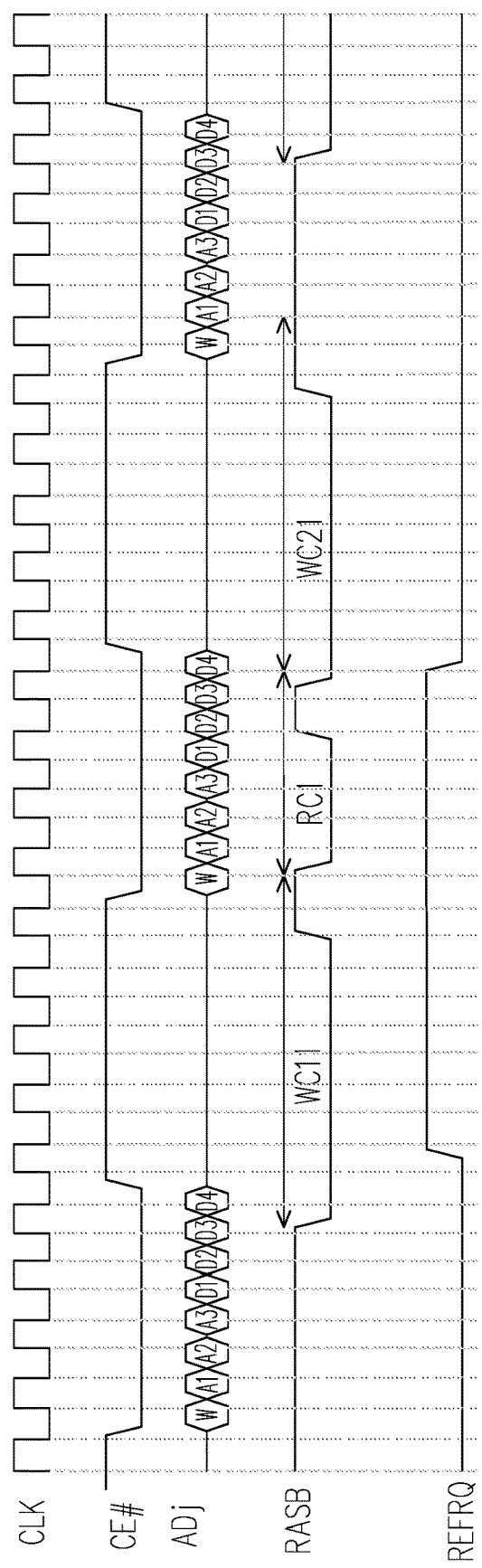
FIG. 1 is a schematic waveform diagram illustrating a conventional refresh method of a pseudo SRAM.
Figure 2:
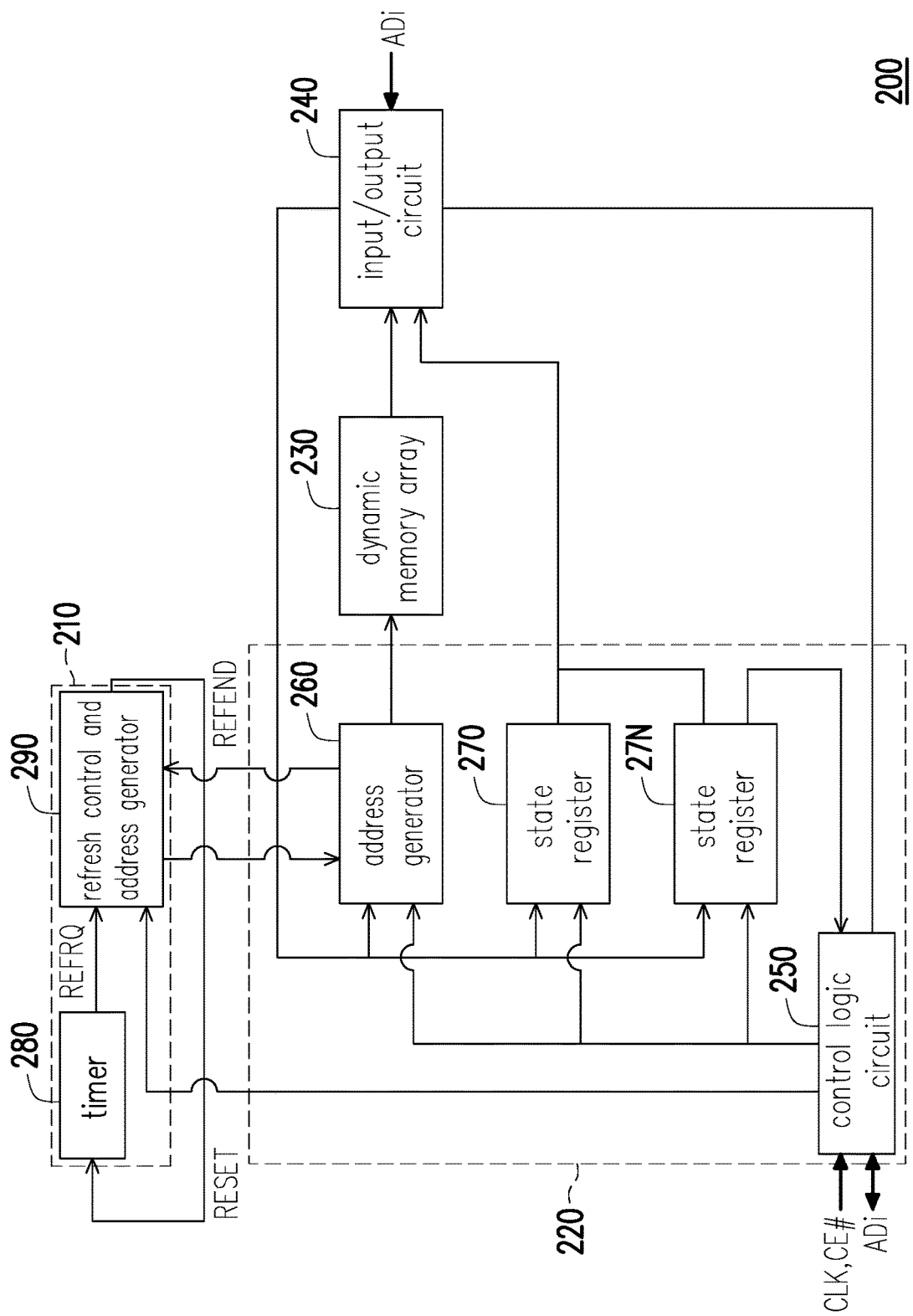
FIG. 2 is a schematic circuit diagram illustrating a pseudo SRAM according to an embodiment of the invention.

Referring to FIG. 2, FIG. 2 is a schematic circuit diagram illustrating a pseudo SRAM according to an embodiment of the invention. A pseudo SRAM 200 includes a refresh signal generator 210, a controller 220, a dynamic memory array 230, and an input/output circuit 240. In the present embodiment, the refresh signal generator 210 is configured to generate a refresh request signal REFRQ and is coupled to the controller 220. The dynamic memory array 230 is configured to store write data and is coupled to the controller 220. The input/output circuit 240 is coupled between the dynamic memory array 230 and the controller 220 and is configured to transmit an address data signal ADi. Specifically, the controller 220 further includes a control logic circuit 250, an address generator 260, and a plurality of state registers 270 to 27N. In the present embodiment, the control logic circuit 250 is configured to receive a chip enable signal CE# and a basic clock signal CLK provided by a signal generator (not illustrated). The address generator 260 is coupled between the dynamic memory array 230 and the control logic circuit 250 and is configured to generate a plurality of address signals. The state registers 270 to 27N are coupled between the control logic circuit 250 and the address generator 260 and are configured to store state information of the pseudo SRAM 200.

Moreover, the refresh signal generator 210 further includes a timer 280 and a refresh control and address generator 290. In the present embodiment, the timer 280 is configured to generate the refresh request signal REFRQ at a predetermined time interval. The timer 280 is coupled to the refresh control and address generator 290. Specifically, the refresh control and address generator 290 generate a reset signal RESET according to a refresh request end signal REFEND and transmits the reset signal RESET to the timer 280 to have the timer 280 reset its timing operation and to thereby disable the refresh request signal REFRQ. Specifically, the refresh request end signal REFEND is generated by the controller 220.

In the present embodiment, the timer 280 may be a conventional counting circuit having a counting function (but is not limited hereto). The control logic circuit 250 may be a logic circuit formed of a plurality of logic gates (but is not limited hereto). The dynamic memory array 230 may be a conventional dynamic random access memory (DRAM) but is not limited hereto. The input/output circuit 240, the address generator 260, the state registers 270 to 27N, and the refresh control and address generator 290 may all be implemented by applying frameworks of memory circuits familiar to people of ordinary skill in the art in the field of integrated circuits.

Figure 4A:
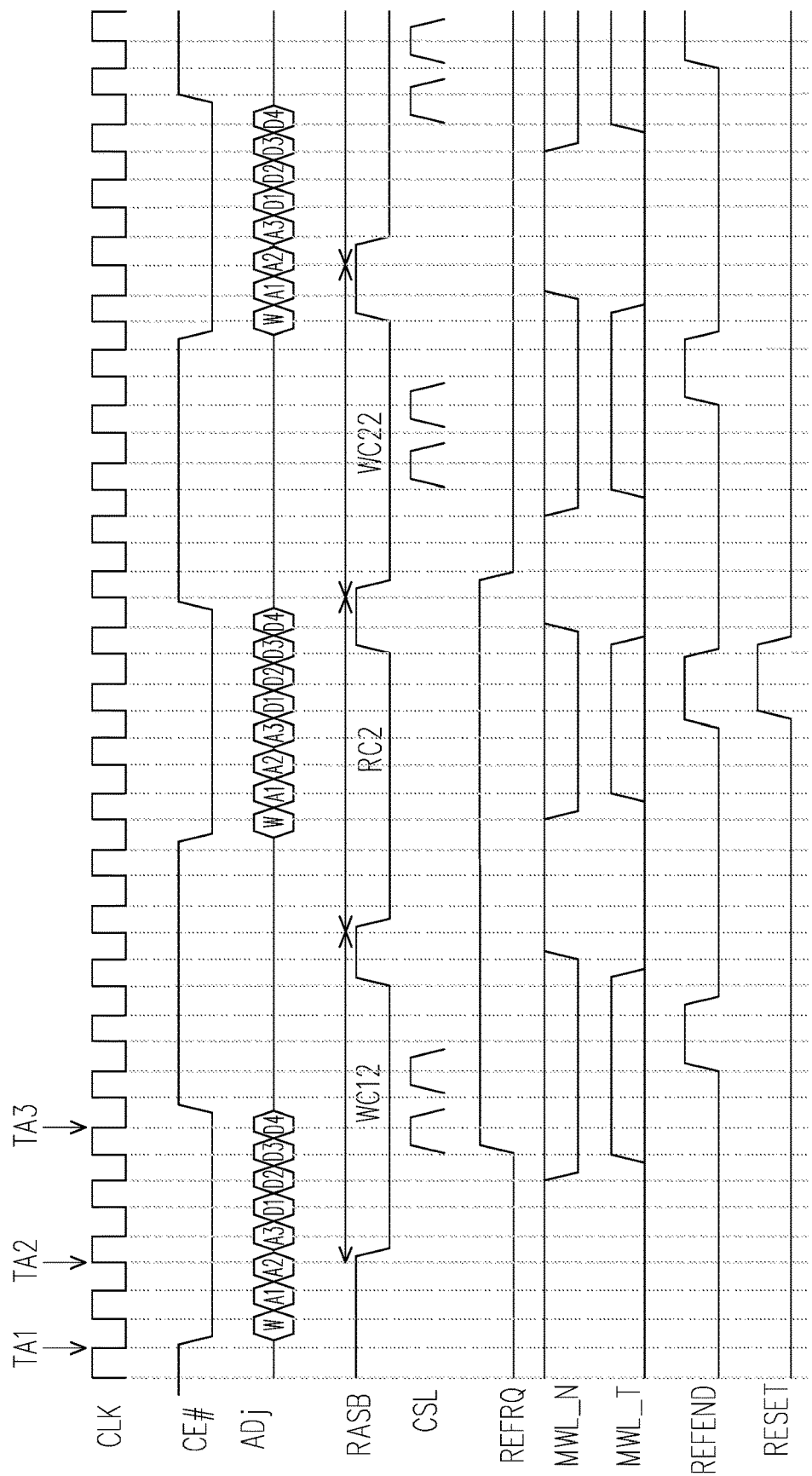
FIG. 4A is a schematic waveform diagram illustrating a refresh method of a pseudo SRAM according to an embodiment of the invention.

Referring to both FIG. 2 and FIG. 4A, FIG. 4A is a schematic waveform diagram illustrating a refresh method of a pseudo SRAM according to an embodiment of the invention. Regarding the operation details of the pseudo SRAM 200, the pseudo SRAM 200 receives the basic clock signal CLK and the chip enable signal CE# through the control logic circuit 250. The control logic circuit 250 may be operated according to the basic clock signal CLK. In the present embodiment, the chip enable signal CE# is a low active signal. In other words, when the chip enable signal CE# is in an enabled state, the chip enable signal CE# is logical low. Of course, in other embodiments of the invention, the chip enable signal CE# may also be a high active signal and is not specifically limited.

In FIG. 4A, the chip enable signal CE# is enabled at a first time point TA1. Meanwhile, the control logic circuit 250 receives the chip enable signal CE# enabled at the first time point TA1 to perform a first write operation, and receives an address data signal ADi in an enabled time period of the chip enable signal CE#, such that address data W, A1 to A3 and write data D1 to D4 can be sequentially received. Next, at a delay time point TA2 after the first time point TA1, the control logic circuit 250 enables a sub-word line driving signal RASB to activate a corresponding sub-word line in the pseudo SRAM 200, such that the pseudo SRAM 200 can start to perform the write operation. Specifically, when the sub-word line driving signal RASB is enabled and executed in a write cycle WC12, the write data D1 to D4 may be written to at least one selected sense amplifier corresponding to the address data W, A1 to A3 through two pulses of the control signal CSL. Specifically, in the present embodiment, the sub-word line driving signal RASB is similarly a low active signal. In other words, when the sub-word line driving signal RASB is in an enabled state, the sub-word line driving signal RASB is logical low. Of course, in other embodiments of the invention, the sub-word line driving signal RASB may also be a high active signal and is not specifically limited.

Moreover, before performing the write operation, the pseudo SRAM 200 needs to select the sense amplifier to which the write data D1 to D4 are to be written through the address data W, A1 to A3. For example, it is supposed that the write data D1, D2 may be respectively written to a first sense amplifier, and the write data D3, D4 may be respectively written to a second sense amplifier (but are not limited hereto). Specifically, the first sense amplifier and the second sense amplifier may respectively be different sense amplifiers.

Next, in FIG. 4A, after the write cycle WC12, when the pseudo SRAM 200 needs to perform a refresh operation to maintain stability of the internal data, the control logic circuit 250 receives a refresh request signal REFRQ generated by the timer 280, such that the control logic circuit 250 can determine whether the refresh request signal REFRQ is enabled according to an end time point TA3 in the enabled time period of the chip enable signal CE# to thereby determine a timing of starting the refresh operation. Specifically, at the end time point TA3, if the control logic circuit 250 determines that the refresh request signal REFRQ is enabled, the control logic circuit 250 may start the refresh operation in a refresh cycle RC2 in which the sub-word line driving signal RASB is enabled.

In brief, if the control logic circuit 250 determines, at the end time point TA3 of the enabled time period of the chip enable signal CE#, that a time point at which the refresh request signal REFRQ starts to be enabled is earlier than the end time point TA3 of the enabled time period of the chip enable signal CE#, it means that, before a next write cycle WC22, in the refresh cycle RC2 in which the sub-word line driving signal RASB is enabled, there is sufficient time for the pseudo SRAM 200 to perform the refresh operation in the refresh cycle RC2.

It is noted that, after the refresh operation is performed (after the refresh cycle RC2 is ended), the controller 220 may correspondingly generate a refresh request end signal REFEND. Specifically, the refresh request end signal REFEND is transmitted to the refresh signal generator 210. The refresh signal generator 210 generates a reset signal RESET according to the refresh request end signal REFEND and transmits the reset signal RESET to the timer 280. The timer 280 may then reset its timing operation according to the reset signal RESET. Moreover, when the sub-word line driving signal RASB enters the write cycle WC22, the refresh request signal REFRQ is reset to a disabled state at the same time.

In the present embodiment, a time difference between the first delay time point TA2 and the first time point TA1 in the pseudo SRAM 200 may be equal to two clock cycles of the basic clock signal CLK. Specifically, in the present embodiment, the time difference between the first time point TA1 of enabling the chip enable signal CE# and the delay time point TA2 of enabling the sub-word line driving signal RASB is reduced in response to the refresh request signal REFRQ that is enabled relatively early to start the refresh operation and thereby improve the issue in the refresh method of the pseudo SRAM in the related art that the time period of the refresh cycle RC1 is overly short due to the new write cycle WC21 which is about to start, such that the refresh operation cannot be effectively performed.

Figure 4B:
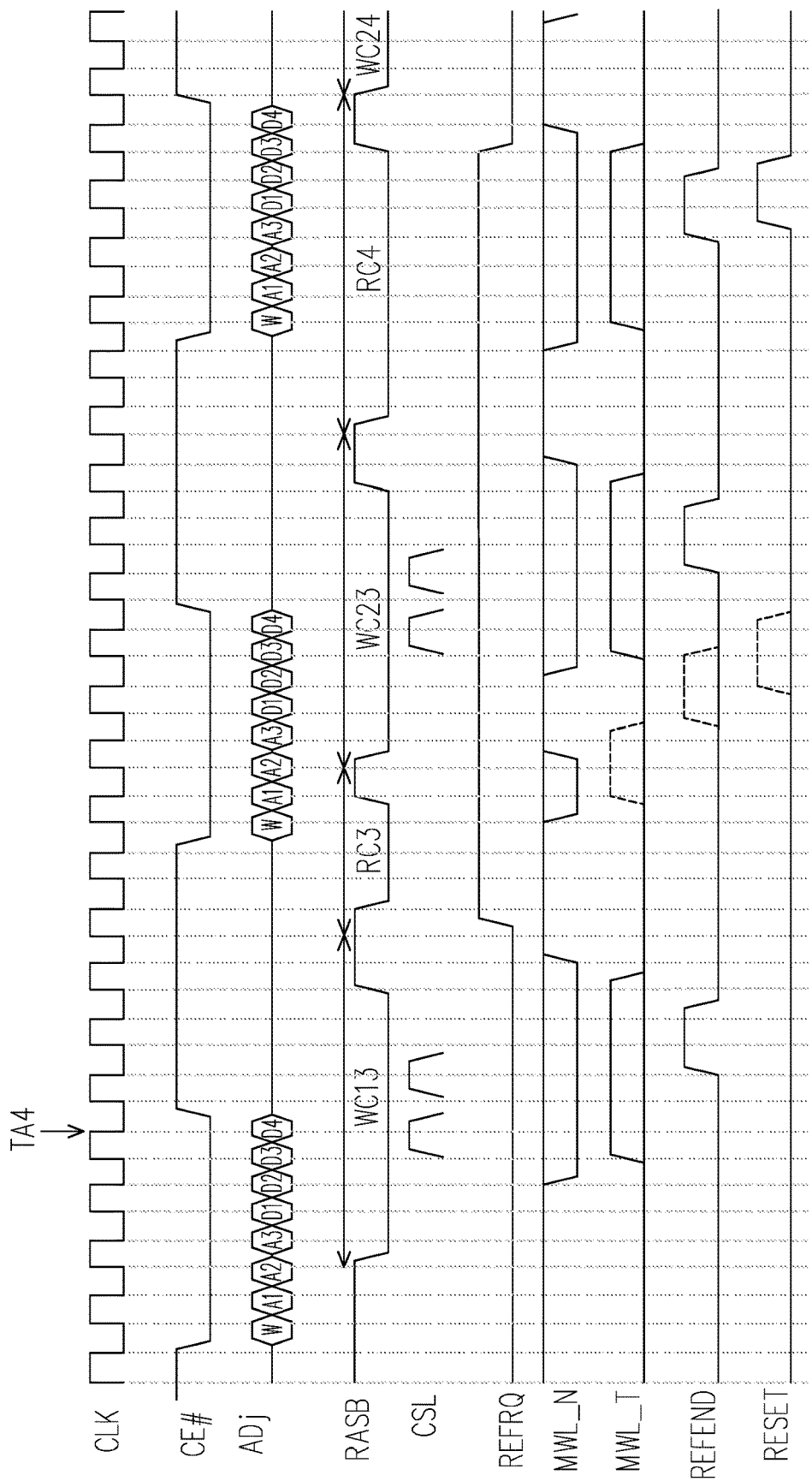
FIG. 4B is a schematic waveform diagram illustrating a refresh method of a pseudo SRAM according to another embodiment of the invention.

Referring to both FIG. 2 and FIG. 4B, FIG. 4B is a schematic waveform diagram illustrating a refresh method of a pseudo SRAM according to another embodiment of the invention. The sequential relationships between the basic clock signal CLK, the chip enable signal CE#, and the address data signal ADi in FIG. 4B are all identical to those in FIG. 4A and in the description of the previous embodiment and shall not be repeatedly described here.

Different from the previous embodiment, in FIG. 4B, after a write cycle WC13, at an end time point TA4 of the enabled time period of the chip enable signal CE#, if the control logic circuit 250 determines that the refresh request signal REFRQ is disabled, the control logic circuit 250 has the sub-word line driving signal RASB perform a second data write operation and does not start the refresh operation. On the other hand, after the end time point TA4 of the enabled time period of the chip enable signal CE#, if the control logic circuit 250 determines that the refresh request signal REFRQ is enabled, because the time period of a refresh cycle RC3 is overly short (with only two cycles of the basic clock signal CLK and the refresh operation cannot be effectively performed, the control logic circuit 250 does not perform the refresh operation in the refresh cycle RC3, but performs the refresh operation in a refresh cycle RC4 after the second data write operation is ended.

Based on the case described above, in the present embodiment, when the sub-word line driving signal RASB is enabled and executed in a write cycle WC23, the refresh request signal REFRQ can still remain in an enabled state, such that, after the write operation of the write cycle WC23 is ended, the pseudo SRAM 200 can perform the refresh operation in the refresh cycle RC4 based on the refresh request signal REFRQ that still remains enabled. Next, when the refresh operation of the refresh cycle RC4 is ended, the controller 220 generates a refresh request end signal REFEND. Specifically, the refresh signal generator 210 receives the refresh request end signal REFEND, generates a reset signal RESET according to the refresh request end signal REFEND, and transmits the reset signal RESET to the timer 280 to have the timer 280 reset its timing operation. When the sub-word line driving signal RASB enters a write cycle WC24, the refresh request signal REFRQ is reset to a disabled state at the same time.

In brief, if the control logic circuit 250 determines, at the end time point TA4 of the enabled time period of the chip enable signal CE#, that a time point at which the refresh request signal REFRQ starts to be enabled is later than the end time point TA4 of the enabled time period of the chip enable signal CE#, in the present embodiment, the enabled time of the refresh request signal REFRQ is extended such that, after the write operation in the write cycle WC23 is completed, the refresh operation can still be performed in the refresh cycle RC4 to maintain stability of the pseudo SRAM 200, which is different from the related art, where the current refresh operation would be ignored in this case.

Figure 3:
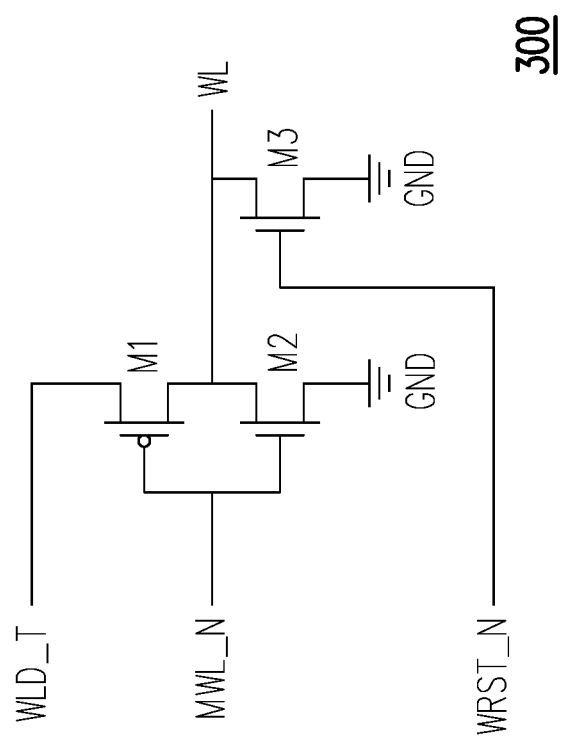
FIG. 3 is a schematic diagram illustrating a driving circuit of a sub-word line according to an embodiment of the invention.

FIG. 3 is a schematic diagram illustrating a driving circuit of a sub-word line according to an embodiment of the invention. It is noted that a word line driving signal WLD_T and a word line control signal MWL_N in FIG. 4A and FIG. 4B are respectively controlled by a driving circuit 300 of a sub-word line in FIG. 3 to drive the sub-word lines in the pseudo SRAM 200 of the invention. Specifically, the driving circuit 300 of the sub-word line includes transistors M1 to M3. Referring to both FIG. 3 and FIG. 4A, an embodiment of the invention is illustrated below. Similarly, another embodiment of the invention may also be implemented in the same manner.

When the sub-word line driving signal RASB needs to be enabled to drive the selected sub-word line, the word line driving signal WLD_T may be set as high and the word line control signal MWL_N may be set as low. Through the low-level word line control signal MWL_N, the transistor M1 may be conducted (the transistor M2 is turned off), and a sub-word line signal WL may be raised to the high level and enabled according to the word line driving signal WLD_T. Conversely, when the sub-word line driving signal RASB stops driving the sub-word line, the word line driving signal WLD_T may be set as low and the word line control signal MWL_N may be set as high. In this state, the transistor M1 is turned off and the transistor M2 is conducted, and the sub-word line signal WL may receive the low level of a reference ground terminal GND and get disabled. On the other hand, the driving circuit 300 of the sub-word line may additionally use a high-level reset signal WRST_N to have the transistor M3 conducted and have the sub-word line signal WL also receive the low level of the reference ground terminal GND and get disabled.

Figure 5:
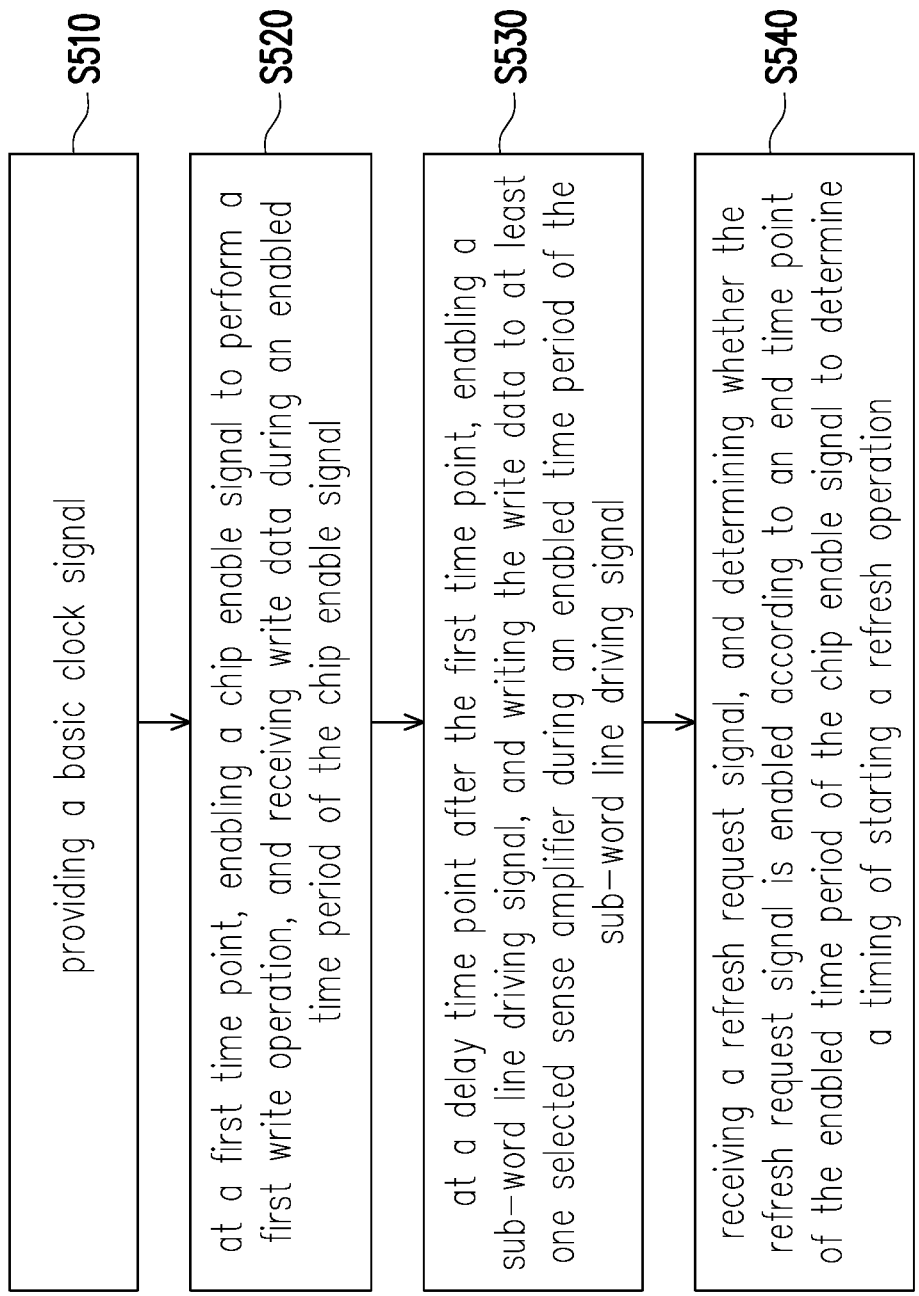
FIG. 5 is a flowchart illustrating a refresh method of a pseudo SRAM according to an embodiment of the invention.

FIG. 5 is a flowchart illustrating a refresh method of a pseudo SRAM according to an embodiment of the invention. Referring to FIG. 4A and FIG. 5, in step S510, the control logic circuit 250 receives a clock signal provided by the signal generator to be used as a basic clock signal CLK of the pseudo SRAM 200. In step S520, at a first time point TA1, a chip enable signal CE# is enabled to perform a first write operation, and an address data signal ADi is received during an enabled time period of the chip enable signal CE#. In step S530, at a delay time point TA2 after the first time point TA1, a sub-word line driving signal RASB is enabled, and the address data signal ADi is written to at least one selected sense amplifier during an enabled time period of the sub-word line driving signal RASB. In step S540, a refresh request signal REFRQ is received, and it is determined whether the refresh request signal REFRQ is enabled according to an end time point TA3 of the enabled time period of the chip enable signal CE# to determine a timing of starting a refresh operation. Implementation details of the steps have all been elaborated in the embodiments and examples above and shall not be repeatedly described here.

In summary of the above, in the invention, the control logic circuit determines the timing of starting the refresh operation according to whether the time point at which the refresh request signal starts to be enabled is earlier or later than the end time point of the enabled time period of the chip enable signal. If the control logic circuit determines that the time point at which the refresh request signal starts to be enabled is earlier than the end time point of the enabled time period of the chip enable signal, it means that there is sufficient time for performing the refresh operation in the refresh cycle in the sub-word line driving signal. Conversely, if the control logic circuit determines that the time point at which the refresh request signal starts to be enabled is later than the end time point of the enabled time period of the chip enable signal, the enabled time of the refresh request signal is extended such that, after the write operation in the write cycle is completed, the refresh operation can still be performed for the write data in the refresh cycle to maintain stability of the pseudo SRAM.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A refresh method for a pseudo static random access memory (SRAM), comprising:
   providing a basic clock signal;
   at a first time point, enabling a chip enable signal to perform a first write operation, and receiving write data during an enabled time period of the chip enable signal;
   at a delay time point after the first time point, enabling a sub-word line driving signal, and writing the write data to at least one selected sense amplifier during an enabled time period of the sub-word line driving signal; and
   receiving a refresh request signal, and determining whether the refresh request signal is enabled according to an end time point of the enabled time period of the chip enable signal to determine a timing of starting a refresh operation.

2. The refresh method according to claim 1, wherein the step of determining whether the refresh request signal is enabled according to the end time point of the enabled time period of the chip enable signal to determine the timing of starting the refresh operation comprises:
   at the end time point of the enabled time period, starting the refresh operation if the refresh request signal is enabled.

3. The refresh method according to claim 2, wherein the step of starting the refresh operation comprises:
   after the end time point of the enabled time period of the chip enable signal, enabling the sub-word line driving signal and performing the refresh operation; and
   after the refresh operation is ended, disabling the refresh request signal.

4. The refresh method according to claim 1, wherein the step of determining whether the refresh request signal is enabled according to the end time point of the enabled time period of the chip enable signal to determine the timing of starting the refresh operation comprises:
   at the end time point of the enabled time period of the chip enable signal, stopping starting the refresh operation to perform a second data write operation, if the refresh request signal is disabled; and
   after the end time point of the enabled time period, if the refresh request signal is enabled, starting the refresh operation after the second data write operation is ended.

5. The refresh method according to claim 4, wherein after the step of performing the refresh operation, the method further comprises:
   after the refresh operation is ended, disabling the refresh request signal.

6. The refresh method according to claim 1, further comprising:
   receiving address data during the enabled time period of the chip enable signal,
   wherein the address data is used to indicate the at least one selected sense amplifier.

7. The refresh method according to claim 1, wherein a time difference between the delay time point and the first time point is equal to two clock cycles of the basic clock signal.

8. A pseudo SRAM comprising:
   a refresh signal generator, generating a refresh request signal;
   a controller, coupled to the refresh signal generator;
   a dynamic memory array, coupled to the controller; and
   an input/output circuit, coupled to the dynamic memory array and the controller,
   wherein the controller is configured to:
      receive a basic clock signal;
      receive a chip enable signal enabled at a first time point to perform a first write operation, and receive write data during an enabled time period of the chip enable signal;
      at a delay time point after the first time point, enable a sub-word line driving signal, and write the write data to at least one selected sense amplifier during an enabled time period of the sub-word line driving signal; and
      receive the refresh request signal, and determine whether the refresh request signal is enabled according to an end time point of the enabled time period of the chip enable signal to determine a timing of starting a refresh operation.

9. The pseudo SRAM according to claim 8, wherein at the end time point of the enabled time period of the chip enable signal, the controller starts the refresh operation if the refresh request signal is enabled.

10. The pseudo SRAM according to claim 9, wherein after the end time point of the enabled time period of the chip enable signal, the controller enables the sub-word line driving signal and performs the refresh operation, and the controller generates a refresh request end signal after the refresh operation is ended,
   wherein the refresh signal generator receives the refresh request end signal, and disables the refresh request signal according to the refresh request end signal.

11. The pseudo SRAM according to claim 8, wherein at the end time point of the enabled time period of the chip enable signal, if the refresh request signal is disabled, the controller stops starting the refresh operation to perform a second data write operation, and after the end time point of the enabled time period, if the refresh request signal is enabled, the controller starts the refresh operation after the second data write operation is ended.

12. The pseudo SRAM according to claim 11, wherein after the refresh operation is ended, the controller generates a refresh request end signal, and the refresh signal generator receives the refresh request end signal and disables the refresh request signal according to the refresh request end signal.

13. The pseudo SRAM according to claim 8, wherein a time difference between the first delay time point and the first time point is equal to two clock cycles of the basic clock signal.

14. The pseudo SRAM according to claim 8, wherein the controller comprises:
   a control logic circuit, receiving the basic clock signal and the chip enable signal;
   an address generator, coupled to the control logic circuit and the dynamic memory array and generating a plurality of address signals; and
   a plurality of state registers, coupled to the address generator and the control logic circuit.

15. The pseudo SRAM according to claim 14, wherein the refresh signal generator comprises:
- a timer, generating the refresh request signal; and
- a refresh control and address generator, coupled to the timer,
- wherein the refresh control and address generator generates a reset signal according to a refresh request end signal, and transmits the reset signal to the timer to disable the refresh request signal.

* * * * *